US009472711B2

(12) United States Patent
Matsuura et al.

(10) Patent No.: US 9,472,711 B2
(45) Date of Patent: Oct. 18, 2016

(54) PHOTOVOLTAIC ELEMENT AND METHOD OF MANUFACTURING THE SAME, AND SOLAR BATTERY MODULE

(75) Inventors: Tsutomu Matsuura, Chiyoda-ku (JP); Hiroya Yamarin, Chiyoda-ku (JP); Hidetada Tokioka, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 14/376,290

(22) PCT Filed: Mar. 29, 2012

(86) PCT No.: PCT/JP2012/002185
§ 371 (c)(1),
(2), (4) Date: Aug. 1, 2014

(87) PCT Pub. No.: WO2013/145008
PCT Pub. Date: Oct. 3, 2013

(65) Prior Publication Data
US 2014/0373896 A1  Dec. 25, 2014

(51) Int. Cl.
*H01L 21/00* (2006.01)
*H01L 31/18* (2006.01)
(Continued)

(52) U.S. Cl.
CPC ......... *H01L 31/1884* (2013.01); *H01L 31/028* (2013.01); *H01L 31/022441* (2013.01); *H01L 31/04* (2013.01); *H01L 31/042* (2013.01); *H01L 31/068* (2013.01); *H01L 31/0682* (2013.01); *H01L 31/075* (2013.01); *H01L 31/0747* (2013.01); *H01L 31/1804* (2013.01); *H01L31/20* (2013.01); *H01L 31/202* (2013.01); *Y02E 10/547* (2013.01); *Y02P 70/521* (2015.11)

(58) Field of Classification Search
CPC .................................................... H01L 31/0747
USPC ........................................................... 438/87
See application file for complete search history.

(56) References Cited

U.S. PATENT DOCUMENTS 4,927,770 A    5/1990  Swanson
7,972,894 B2 *  7/2011  Veschetti ............ H01L 31/0745
                                                          438/72
(Continued)

FOREIGN PATENT DOCUMENTS

JP    63-215081    9/1988
JP    04-130671    5/1992
(Continued)

OTHER PUBLICATIONS

International Search Report issued May 15, 2012, in PCT/JP12/002185, filed Mar. 29, 2012.

*Primary Examiner* — Chandra Chaudhari
(74) *Attorney, Agent, or Firm* — Oblon, McClelland, Maier & Neustadt, L.L.P.

(57) ABSTRACT

A back contact heterojunction photoelectric conversion device, that obtain junctions that are nearly ohmic contacts by integrally forming a transparent conductive film including an electrode directly on a p-type amorphous silicon film and a transparent conductive oxide directly on an n-type amorphous silicon film. A method of manufacturing the device includes: integrally forming an oxide electrode layer on the n-type amorphous silicon film and the p-type amorphous silicon film; and applying plasma, under a condition that a mask is disposed on the transparent conductive film covering either the n-type amorphous silicon film or the p-type amorphous silicon film, to exposed portions of transparent conductive film.

11 Claims, 12 Drawing Sheets

(51) Int. Cl.
  *H01L 31/068*   (2012.01)
  *H01L 31/0747*  (2012.01)
  *H01L 31/20*    (2006.01)
  *H01L 31/0224*  (2006.01)
  *H01L 31/028*   (2006.01)
  *H01L 31/042*   (2014.01)
  *H01L 31/075*   (2012.01)
  *H01L 31/04*    (2014.01)

(56) References Cited

U.S. PATENT DOCUMENTS 8,450,141 B2 * 5/2013 Birkmire ............ H01L 31/02168
                                                    438/98

2005/0062041 A1   3/2005  Terakawa et al.
2010/0032014 A1 * 2/2010  Bettinelli ............ H01L 31/0747
                                                    438/96
2010/0078069 A1   4/2010  Ide

FOREIGN PATENT DOCUMENTS

| | | |
|---|---|---|
| JP | 10-070297   | 3/1998  |
| JP | 2005-101240 | 4/2005  |
| JP | 2005-101427 | 4/2005  |
| JP | 2008-283075 | 11/2008 |
| JP | 2009-200267 | 9/2009  |
| JP | 2010-080888 | 4/2010  |
| JP | 2011-171384 | 9/2011  |

* cited by examiner

PHOTOVOLTAIC ELEMENT AND METHOD OF MANUFACTURING THE SAME, AND SOLAR BATTERY MODULE

TECHNICAL FIELD

This invention relates to back contact photovoltaic elements whose p-n junctions and collector electrodes are arranged on one side of a crystalline silicon substrate, a method of manufacturing the same, and a solar battery module using the photovoltaic elements.

BACKGROUND ART

In recent years, crystalline silicon photovoltaic elements using a monocrystalline silicon substrate or a polycrystalline silicon substrate (simply referred to as photovoltaic elements in some cases below) are being vigorously developed. Especially, those using the monocrystalline silicon substrate are excellent in photoelectric conversion efficiency, and are spreading as the price of silicon wafers is lowered. For some usage such as urban housing with a limited installation space, it is required to further improve the photoelectric conversion efficiency.

One of methods for improving the conversion efficiency of the crystalline silicon photovoltaic elements is a back contact (back face juncture) cell, in which electrodes blocking light are not formed on a light receiving face, but are formed on the back only. Because of its high light utilization efficiency, the back contact cell is excellent in the photoelectric conversion efficiency, and is already used widely in practice.

On the other hand, a heterojunction cell which is a combination of the crystalline silicon substrate and an amorphous silicon thin film has an open circuit voltage higher than those of general crystalline silicon photovoltaic elements to have higher photoelectric conversion efficiency. Because the amorphous silicon thin film is formed on the crystalline silicon substrate, the heterojunction cell is a technique also referred to as hybrid.

Then, proposed is a back contact heterojunction photovoltaic element which is a combination of these techniques (for example, refer to Patent Document 1). Its detailed configuration is that on the back of a monocrystalline silicon substrate, an i-type amorphous silicon film is formed, on which a p-type amorphous silicon film, a back electrode and a collector electrode are formed for serving as a positive electrode, and on which an n-type amorphous silicon film, a back electrode and a collector electrode are formed for serving as a negative electrode.

PRIOR ART DOCUMENT

Patent Document

Patent Document 1: Japanese Patent Laid-Open Publication No. 2005-101427

SUMMARY OF THE INVENTION

Problem to be Solved by the Invention

In the conventional back contact heterojunction photovoltaic element, ohmically junctioned transparent conductive oxide (TCO) layers are used for electrodes that are disposed directly on the p-type amorphous silicon film and the n-type amorphous silicon film. Because the ionization potential of p-type silicon is different from that of n-type silicon, the junctions to TCO are not always ohmic ones. Thus, the resistivity on the p-type silicon film sometimes largely differs from that on the n-type silicon film. In order to ensure a small resistivity junction on the p-type and n-type silicon films, TCO layers suitable for the respective films are to be formed.

However, in such a method, it is necessary to perform TCO layer film formation for two times separately, complicating its manufacturing steps.

The present invention is made to solve the problem described above, and made in order that while simplifying the TCO layer film forming process to a single step, a back contact photovoltaic element on a face of which the electrodes for the p-type and n-type semiconductor layers are provided can be formed so as to have a small resistivity junction on each of the p-type and n-type semiconductor films, thereby obtaining a photovoltaic element having a small conduction loss.

Means for Solving Problem

A method of manufacturing a photovoltaic element includes: a step of forming an n-type semiconductor layer on a first region of a face of a semiconductor crystal substrate; a step of forming a p-type semiconductor layer on a second region of the face; a step of integrally forming a contact electrode layer, whose chief element is oxide, on the face, and surfaces of the n-type semiconductor layer and the p-type semiconductor layer; a step of adjusting a carrier density of the contact electrode layer above either the first region or the second region so that a carrier density of the contact electrode layer above the first region becomes larger than a carrier density of the contact electrode layer above the second region; and a step of cutting the contact electrode layer to separate the contact electrode layer above the first region and the contact electrode layer above the second region.

Effect of the Invention

According to the present invention, the contact electrode layers are junctioned to the p-type and n-type semiconductor layers with their interfaces being ohmic or nearly ohmic. Therefore, the series resistance in the photovoltaic element is reduced, thereby improving the photovoltaic element's property.

MODES FOR CARRYING OUT THE INVENTION

Based on views, detailed explanation will be made below about embodiments of photovoltaic elements, methods of manufacturing the same and photoelectric conversion modules according to the present invention. It should be noted that the present invention is not limited to descriptions below, and the embodiments may be appropriately modified without departing from the scope of the invention. In addition, scales of the components in the views shown below may differ from actual ones for easy understanding.

Embodiment 1

Figure 1:
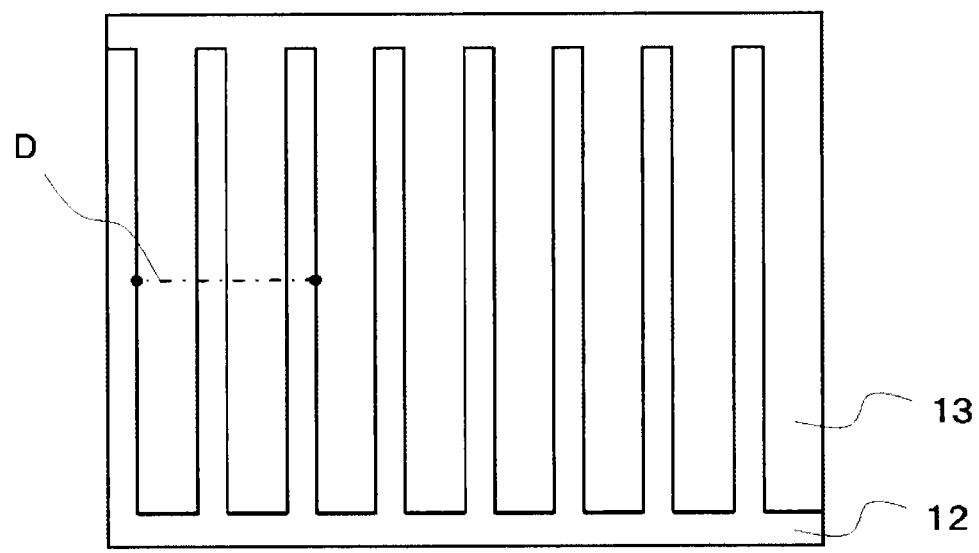
FIG. 1 is a plan view showing the back of a photovoltaic element according to Embodiment 1 of the present invention.

FIG. 1 is a plan view that schematically shows the back of a crystalline silicon photovoltaic element according to Embodiment 1 of the present invention. A comb-teeth-shaped negative electrode 12 and positive electrode 13 are arranged so that their comb teeth are engaged with each other. A minute gap is provided between the negative electrode 12 and the positive electrode 13, so that there is no overlapped portion therebetween. On the other hand, a surface opposing the back is a light receiving face, which has no distinctive structure. That is, the photovoltaic element is a back contact photovoltaic element whose electrodes are provided only on the back. The photovoltaic element is a heterojunction photovoltaic element in which so-called heterojunction is formed by forming on a surface of crystalline silicon, an amorphous silicon thin film having a band gap different from that of the crystalline silicon. Therefore, for the negative electrode 12 and the positive electrode 13, an n-type amorphous silicon thin film and a p-type amorphous silicon thin film are formed as an n-type semiconductor layer and a p-type semiconductor layer, respectively.

Figure 2:
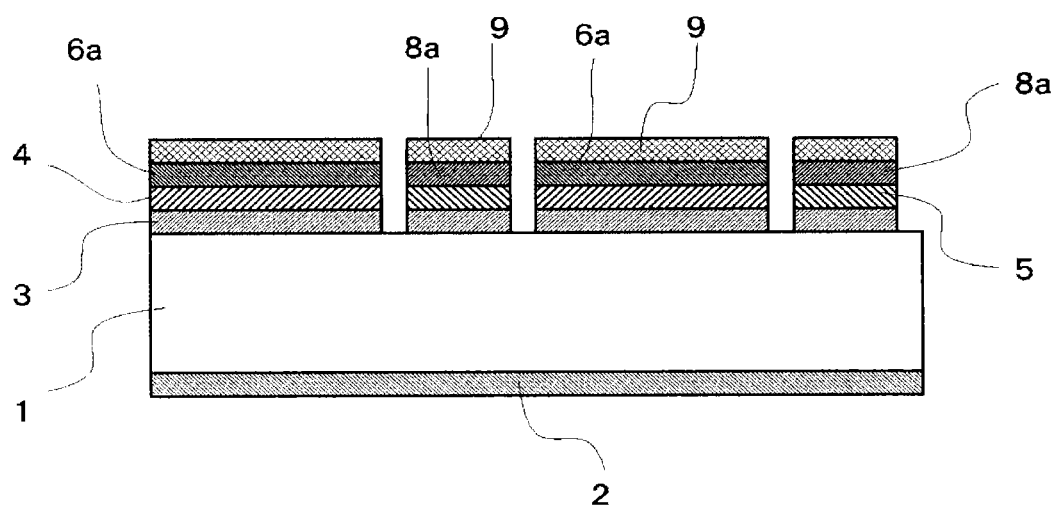
FIG. 2 is a partial cross-sectional view showing the structure of the photovoltaic element according to Embodiment 1 of the present invention.

FIG. 2 is a cross-sectional view showing the structure of the photovoltaic element of Embodiment 1 to schematically show a section indicated by a line segment D in FIG. 1. In the photovoltaic element, as for a monocrystalline silicon substrate 1 on surfaces of which an uneven structure referred to as texture is formed, a passivation film 2 is formed on the light receiving face of the substrate; and on the back of the substrate, an amorphous silicon layer, a transparent electrode layer, and a metal electrode are layered in this order. The amorphous silicon layer includes an i-type amorphous silicon film 3, an n-type amorphous silicon film 5, and a p-type amorphous silicon film 4; the transparent electrode layer includes a transparent conductive film 6a, and a transparent conductive film 8a. The transparent electrode layer is a layer whose chief element is, for example, conductive metal oxide; on the layer, metal electrodes 9 are formed to be electrically connected. Light to be photoelectrically converted enters from the light receiving face on the side of which the passivation film 2 is formed.

FIG. 3 to FIG. 10 are enlarged sectional views illustrating steps for manufacturing the photovoltaic element according to Embodiment 1 of the present invention, to schematically show the section indicated by the line segment D in FIG. 1. Explanation will be made below in the order of steps, about manufacturing the photovoltaic element according to Embodiment 1 of the present invention.

Figure 3:
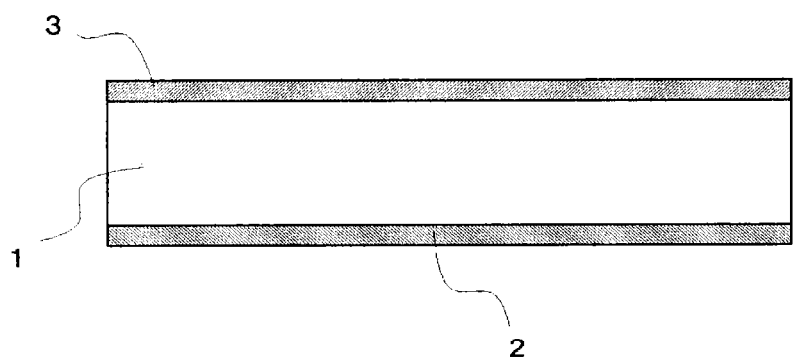
FIG. 3 is an enlarged sectional view illustrating a step for manufacturing the photovoltaic element according to Embodiment 1 of the present invention.

First, the passivation film 2 is formed on the light receiving face of the n-type monocrystalline silicon substrate 1, on the back of which the i-type amorphous silicon film 3 (an intrinsic amorphous silicon film) is formed (Step 1). FIG. 3 shows a state after the formation. The i-type amorphous silicon film 3 not only acts as a passivation film for the monocrystalline silicon substrate 1, but also prevents dopants from mutually entering the monocrystalline silicon substrate 1 and each amorphous silicon film to be formed on the i-type amorphous silicon film.

Figure 4:
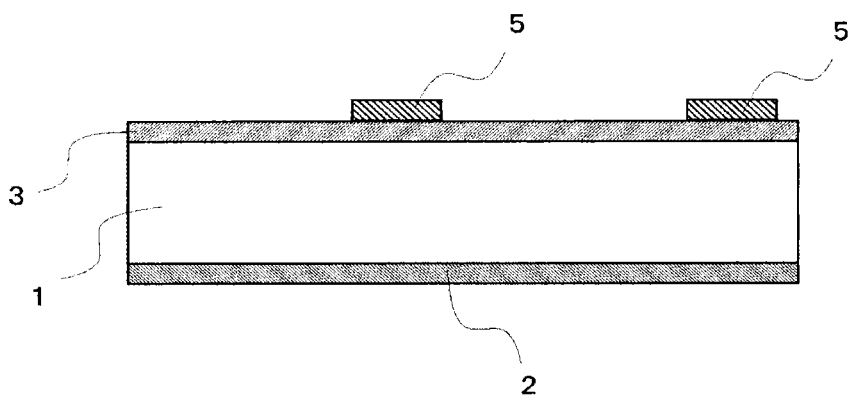
FIG. 4 is an enlarged sectional view illustrating another step for manufacturing the photovoltaic element according to Embodiment 1 of the present invention.
Figure 5:
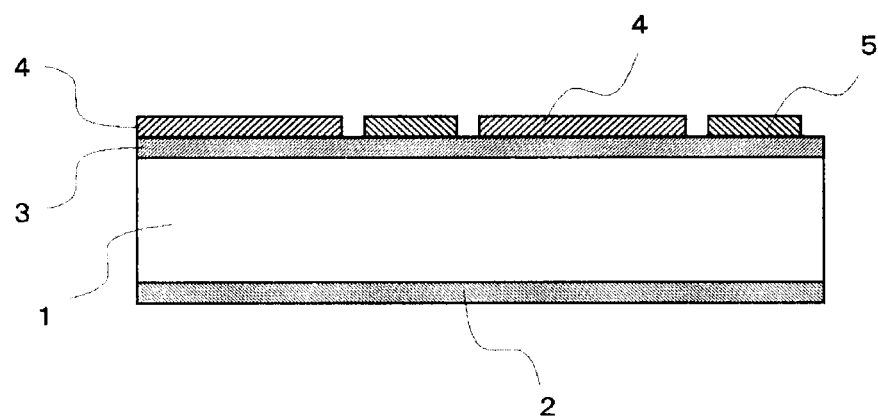
FIG. 5 is an enlarged sectional view illustrating another step for manufacturing the photovoltaic element according to Embodiment 1 of the present invention.

Next, a predetermined region of a surface of the i-type amorphous silicon film 3 is covered with a mask, and then the n-type amorphous silicon 5 is formed (Step 2). FIG. 4 shows a state in which the mask is removed after the n-type amorphous silicon 5 is formed. Next, a predetermined region including the n-type amorphous silicon film 5 is covered with a mask, and then the p-type amorphous silicon film 4 is formed (Step 3). FIG. 5 shows a state in which the mask is removed after the p-type amorphous silicon film 4 is formed. A plasma CVD method is suitable for forming the i-type amorphous silicon film 3, the p-type amorphous silicon film 4, and the n-type amorphous silicon 5.

Figure 6:
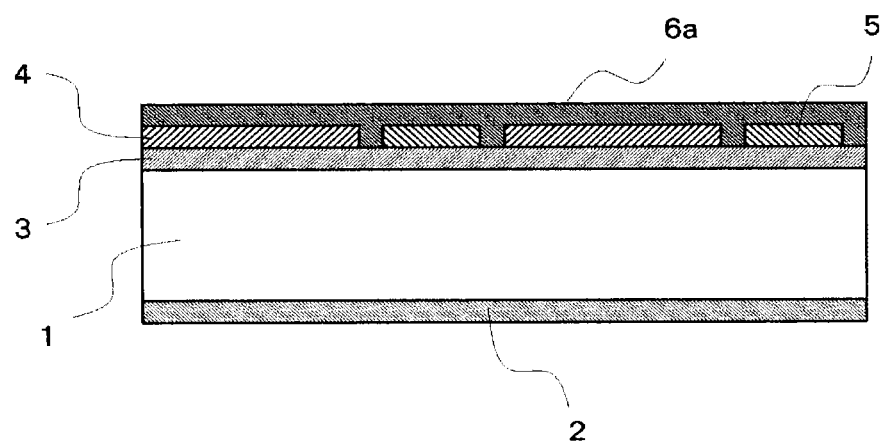
FIG. 6 is an enlarged sectional view illustrating another step for manufacturing the photovoltaic element according to Embodiment 1 of the present invention.

Next, over the p-type amorphous silicon film 4 and the n-type amorphous silicon film 5, a transparent conductive film 6a is integrally formed (Step 4). The transparent conductive film 6a can be formed by using, for example, a sputtering deposition method. FIG. 6 shows a state in which the transparent conductive film 6a is formed. The transparent conductive film 6a serves as a contact electrode layer that is electrically connected to the p-type amorphous silicon film 4 and the n-type amorphous silicon film 5.

Figure 7:
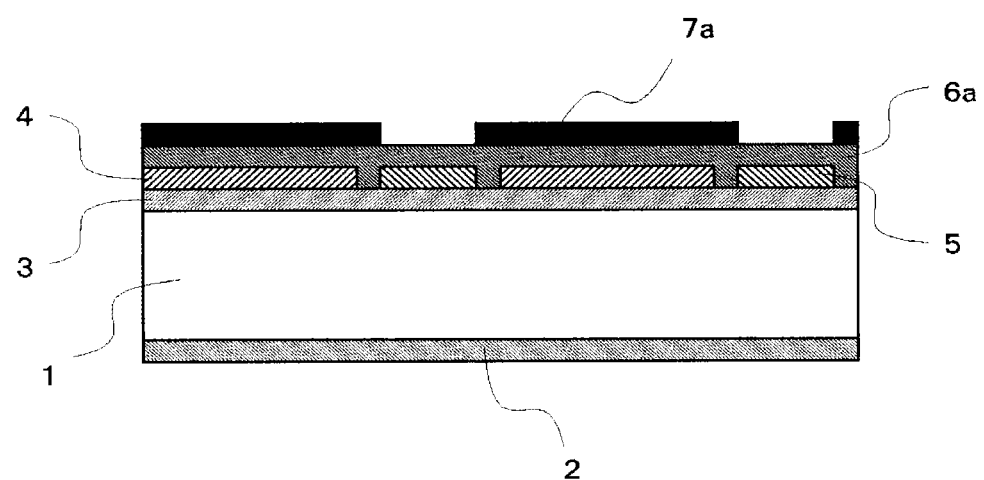
FIG. 7 is an enlarged sectional view illustrating another step for manufacturing the photovoltaic element according to Embodiment 1 of the present invention.
Figure 8:
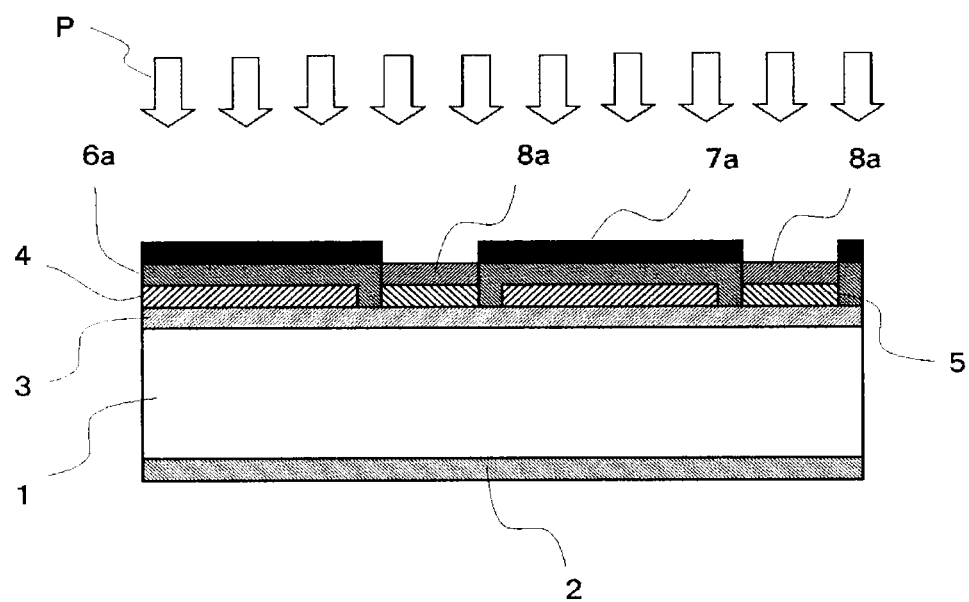
FIG. 8 is an enlarged sectional view illustrating another step for manufacturing the photovoltaic element according to Embodiment 1 of the present invention.

After forming the transparent conductive film 6a, a protective mask 7a is disposed so as to cover the p-type amorphous silicon film 4 in order to perform plasma treatment. FIG. 7 is a state in which the protective mask 7a is formed. Next, as shown in FIG. 8, plasma P is applied in the state in which the protective mask 7a is disposed (Step 5). Here, an exposed portion of the transparent conductive film 6a is reduced using hydrogen plasma produced in a vacuum chamber. By this treatment, the transparent conductive film 6a on the amorphous silicon film 5 is reduced, to become a transparent conductive film 8a having a carrier density higher than that of the transparent conductive film 6a.

Figure 9:
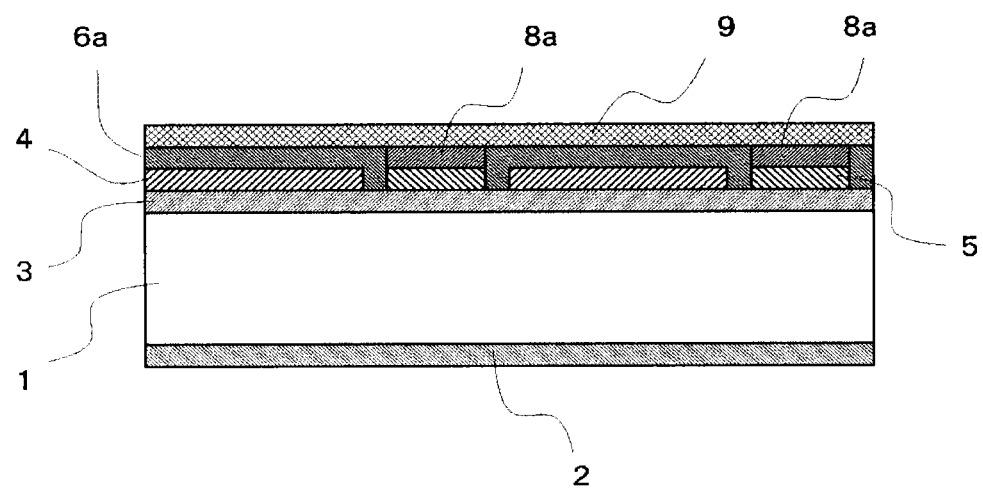
FIG. 9 is an enlarged sectional view illustrating another step for manufacturing the photovoltaic element according to Embodiment 1 of the present invention.

Next, the protective mask 7a is removed, and then, a metal electrode layer 9 is formed, as shown in FIG. 9, directly on the transparent conductive film 6a (Step 6).

Figure 10:
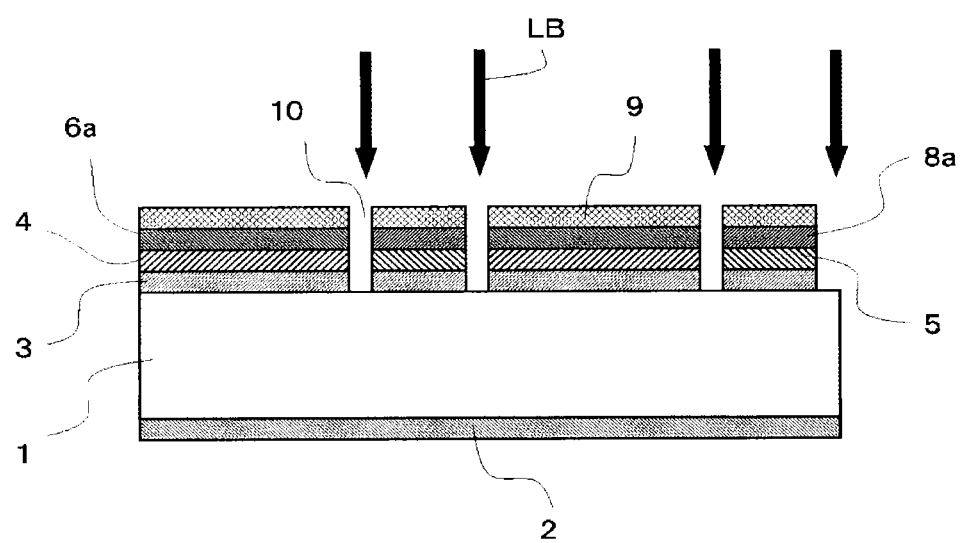
FIG. 10 is an enlarged sectional view illustrating another step for manufacturing the photovoltaic element according to Embodiment 1 of the present invention.

Next, the metal electrode layer 9 is cut and separated into a region above the p-type amorphous silicon film 4 and a region above the n-type amorphous silicon film 5, and the transparent conductive film 6a and the transparent conductive film 8a are also cut and separated from each other. By these cuttings, the p-type and n-type amorphous silicon regions are completely separated from each other. The separation is performed, for example, by laser scribing by means of laser radiation (Step 7). FIG. 10 shows a state after the laser scribing. Arrows LB in the figure indicate application positions and directions of the laser beam, and a scribed trail 10 is formed on the application portions.

Figure 11:
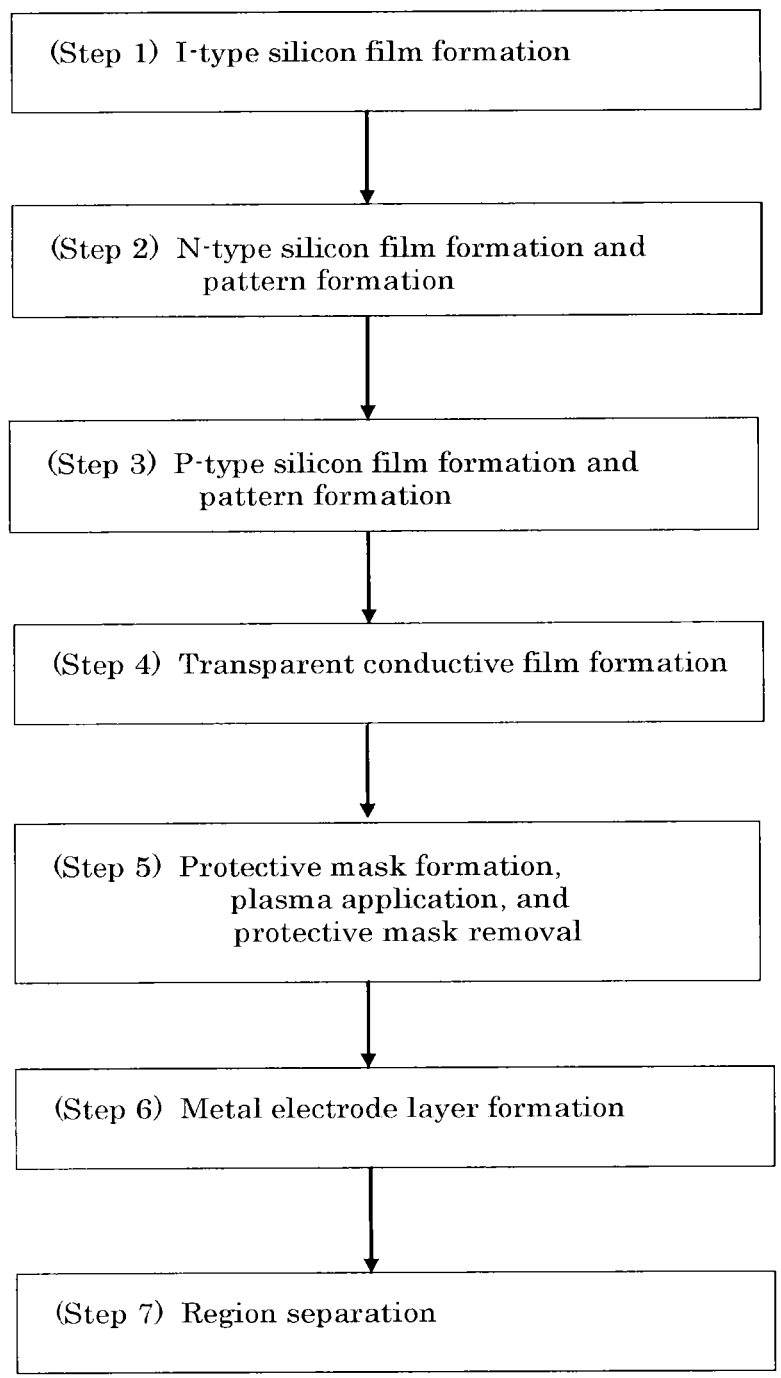
FIG. 11 is a flow chart illustrating steps of manufacturing the photovoltaic element according to Embodiment 1 of the present invention.

FIG. 11 represents steps of manufacturing the photovoltaic element described above with a flow chart. After Step 7 in which the transparent conductive film regions are separated, if necessary, an additional process is performed, such as forming a bus electrode configured with a thick film containing metal particles, or disposing a collector electrode pattern and a wiring sheet having connector portions overlappingly, to complete a heterojunction photovoltaic element (solar battery cell) having a back contact structure.

Explanation will be made below about the manufacturing steps in detail. The monocrystalline silicon substrate 1 is a substrate material sliced off from an ingot, on which a gettering treatment is performed to remove unnecessary impurities on and in vicinities of the surfaces. In order to reduce the light reflectance of the surface, the monocrystalline silicon substrate 1 is immersed in an alkaline aqueous solution such as KOH (potassium hydroxide), NaOH (sodium hydroxide), or TMAH (tetramethylammonium hydroxide), to form pyramid-shaped minute unevenness on the surface of the monocrystalline silicon substrate 1 by an anisotropic etching method. Then, from the surface on which the pyramid-shaped minute unevenness is formed, metal and organic impurities are removed by cleaning the substrate.

Amorphous SiOx, amorphous SiNx, or the like is used for the passivation film 2. The formation of the passivation film 2 causes an improvement in the interface property of the monocrystalline silicon substrate 1a, so that the current loss by carrier recombination can be reduced. The passivation film may be adjusted in its film thickness so as to additionally have a function as an antireflection film for the incident light. The passivation film 2 can be formed by a chemical gas-phase method such as plasma CVD, a physical method such as sputtering deposition and ion plating, or thermal oxidation. Because it is necessary to reduce damages on the surface of the monocrystalline silicon substrate 1 in order to maximize the effect of the improvement of the interface property, the plasma CVD or ion plating is especially preferable as the formation method. Furthermore, an antireflection film may be additionally formed on the passivation film 2. In this case, besides SiOx and SiNx, a transparent oxide such as TiOx, ZnO or $In_2O_3$ may be utilized.

A plasma CVD method is desirable for forming the i-type amorphous silicon film 3 in Step 1, in which $SiH_4$ (silane) gas and $H_2$ (hydrogen) gas are introduced to the vacuum chamber to form the film. Before the formation of the i-type amorphous silicon film 3, it is desirable to remove an oxide film formed naturally on the monocrystalline silicon substrate 1, using a hydrofluoric acid based solution. Next, a predetermined region on the i-type amorphous silicon film 3 is covered with a mask; and then the n-type amorphous silicon 5 is formed in Step 2. A desirable formation method is the plasma CVD method, in which $SiH_4$ gas, $H_2$ gas and $PH_3$ (phosphine) gas are introduced to the vacuum chamber for the formation. The material of the mask may be metal, quartz or the like, but the most desirable one is quartz that is not contaminated with metal.

In Step 3, a mask is put so as to cover the n-type amorphous silicon film 5; and then, the p-type amorphous silicon film 4 is formed. A desirable formation method is the plasma CVD method, in which $SiH_4$ gas, $H_2$ gas and $B_2H_6$ (diborane) gas are introduced to the vacuum chamber for the formation. It is preferable to provide a certain gap between the p-type amorphous silicon film 4 and the n-type amorphous silicon film 5 so that their formation regions do not overlap. The order of forming the p-type amorphous silicon film 4 and the n-type amorphous silicon film 5 may be reversed.

In the photovoltaic device described above, electromotive force is generated at a p-n junction between the p-type amorphous silicon film 4 and the n-type monocrystalline silicon substrate 1. Comparison between the diffusion lengths of electron and hole shows that the diffusion length of hole is shorter than that of electron. Therefore, if the formation region of the p-type amorphous silicon 5 is broader than that of the n-type amorphous silicon film 5, the electricity production efficiency is raised.

A desirable material used in Step 4 for the transparent conductive film 6a is a metal oxide such as $In_2O_3$ (indium oxide), $SnO_2$ (tin oxide), ZnO (zinc oxide) or $TiO_2$ (titanium oxide). These oxides have a characteristic of n-type semiconductor. In order to raise the conductivities of the metal oxide, dopant may be contained in the oxide. Desirable dopants for respective oxides are as follows: Sn, Ti, Zn, Zr, Hf and W for $In_2O_3$; In, Ti, Sb and F for $SnO_2$; Al, Ga, In, Ti, B and F for ZnO; and, Nb, Ta and W for $TiO_2$. As for methods for forming the transparent conductive film 6a, there are a chemical gas-phase method such as plasma CVD, and a physical gas-phase method such as sputtering and ion plating; however, for mass production, the sputtering deposition or ion plating is desirable because an in-line formation is possible. Before forming the transparent conductive film 6a, it is also desirable to remove oxide films formed naturally on the surfaces of the amorphous silicon films 4 and 5, using a hydrofluoric acid based solution or the like.

A metal material, quartz or the like can be used as the material of the protective mask 7a covering the p-type amorphous silicon film 4. Because the metal oxide is reduced by applying plasma to become a factor of contamination, the metal material is more preferable. In the region that is a part of the transparent conductive film 6a and is not covered with the protective mask 7a, the carrier density can be raised by applying reducing plasma.

Atmospheric-pressure plasma or low pressure plasma in a vacuum chamber is applicable as the plasma P in treatment in Step 5. For example, $H_2$ (hydrogen) gas or an ionized gas mixture of $H_2$ and Ar (argon) is suitable. In addition, it is also possible to use a rare gas except Ar. By applying the plasma to the transparent conductive film 6a on the n-type amorphous silicon film 5, the application region of the conductive film is reduced, raising its carrier density. This results in a condition that the junction to the n-type amorphous silicon film 5 is nearly ohmic, so that the application region is changed into the transparent conductive film 8a having a reduced contact resistance for the amorphous silicon film 5. Hereby, the fill factor of the photovoltaic element can be maximized.

The following is an explanation about the principle of how the junction resistance between the amorphous silicon and the transparent conductive film is lowered. The oxide conductive material such as $In_2O_3$ or ZnO is a degenerated semiconductor, and the energy state of their carrier is considered to be essentially similar to that of metal. Therefore, it can be understood that their junctions to the amorphous silicon are similar to those to metal. More specifically, if the oxide conductive material's work function is greater than the ionization potential of n-type silicon, Schottky barrier is formed; however, if the oxide conductive material's work function is smaller than the ionization potential of n-type silicon, the oxide conductive material is ohmically junctioned. Therefore, even if the transparent conductive film 6a formed on the n-type amorphous silicon 5 is not ohmically junctioned, the junction can be changed to an ohmic one or a nearly ohmic one by reducing the film through a plasma treatment to raise its carrier density and thereby decreasing the work function. By controlling the carrier density so that the junction is as near as possible to ohmic junction and thereby lowering the junction's contact resistance, a photovoltaic element having a small conduction loss can be obtained.

Figure 12:
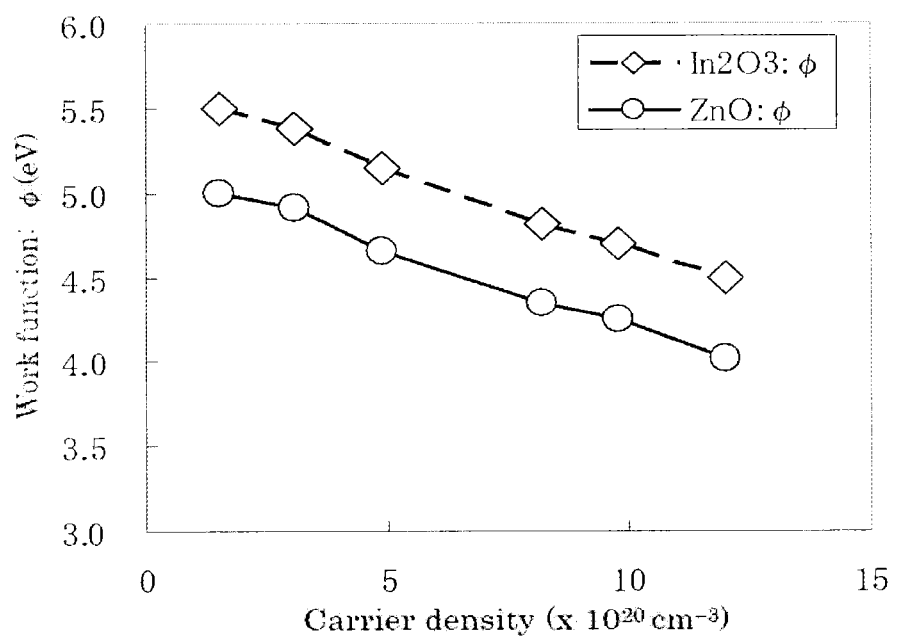
FIG. 12 shows relations between carrier densities and work functions of a transparent conductive film.

FIG. 12 is a graph showing relations between carrier densities and work functions of the transparent conductive film. From FIG. 12, it is found that, with respect to $In_2O_3$ and ZnO, their work functions are decreased as their carrier densities are increased. The work functions can be measured by an ultraviolet photoelectron spectroscopy (UPS) or the like. This indicates that by reducing the TCO and thereby raising the carrier density, the TCO can be improved so as to have a smaller work function, resultantly having a smaller resistance value.

In Step 6, the metal electrode 9 is formed directly on the transparent conductive films 6a and 8 by using a method such as sputtering deposition, electron beam vapor deposition, or screen printing. Because the transparent conductive films 6a and 8 also have a function of a collector electrode, the metal electrode 9 may not necessarily be formed over the whole surfaces of the transparent conductive films 6a and 8. In this case, if incident light from the light receiving face of the photovoltaic element reaches a back side thereof, the reflection light cannot be utilized without the metal electrode 9. Therefore, after the photovoltaic element in which the metal electrodes are partially formed is completed, it is desirable that a reflection member such as a white plate is provided in the back side when the element is modularized.

A desirable material for the metal electrodes is Ag (silver), Al (aluminum), Ti (titanium), Mo (molybdenum), W (tungsten) or the like.

In laser scribing of Step 7, a laser such as a YAG laser or an SHG laser can be used. The amorphous silicon can be cut by a laser beam with a wavelength such as 355 nm or 532 nm, and the transparent conductive film 6a is also cut at the same time. A laser beam with a wavelength of 1064 nm passes through the amorphous silicon; therefore, only the transparent conductive film 6a is cut. Because the narrower the scribing width, the larger an area for contributing to electricity production, it is desirable that the scribing width is 100 μm or less. The narrowest limit thereof is determined by the laser beam width, i.e. about 50 μm. After the laser scribing, a passivation film may be formed on the interface close to the scribed groove by thermal oxidation or the like.

According to the photovoltaic element of this embodiment, the transparent conductive film 6a formed at one time has small resistances on respective junction interfaces with the p-type amorphous silicon film 4 and the n-type amorphous silicon 5, thereby lowering a series resistance in the photovoltaic element to increase the fill factor thereof. This results in an improvement of the photoelectric conversion efficiency in the photovoltaic element.

If formation of the transparent conductive film on the p-type amorphous silicon film 4 and the transparent conductive film on the n-type amorphous silicon 5 is performed two times separately, raw material is necessary for each formation, and the film formation time also becomes more than doubled, leading to less productivity and less yield. In addition, heating after the TCO film formation causes a change in a property of the film, leading to a problem that it is difficult to obtain a film having an optimal property. According to this embodiment, without the problems described above, a good photoelectric conversion property and a high productivity can be obtained while integrally forming the transparent conductive film.

Embodiment 2

Figure 13:
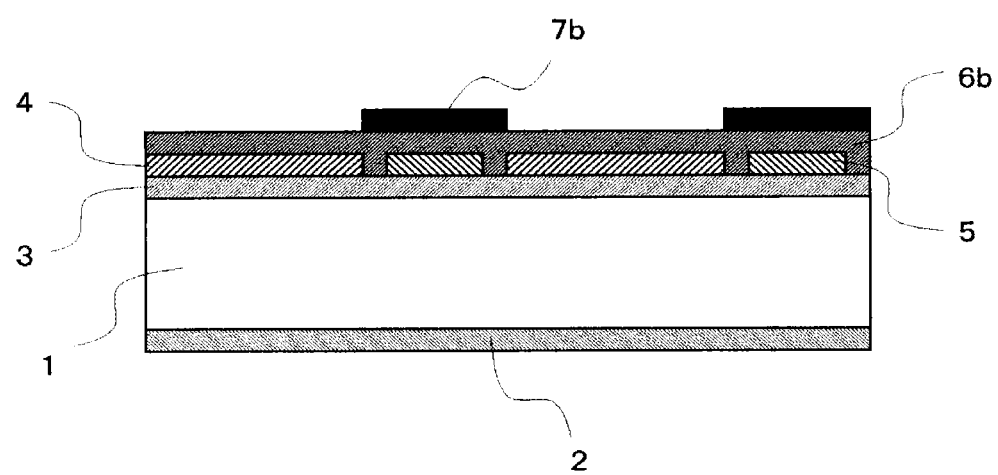
FIG. 13 is an enlarged sectional view illustrating a step for manufacturing a photovoltaic element according to Embodiment 2 of the present invention.
Figure 14:
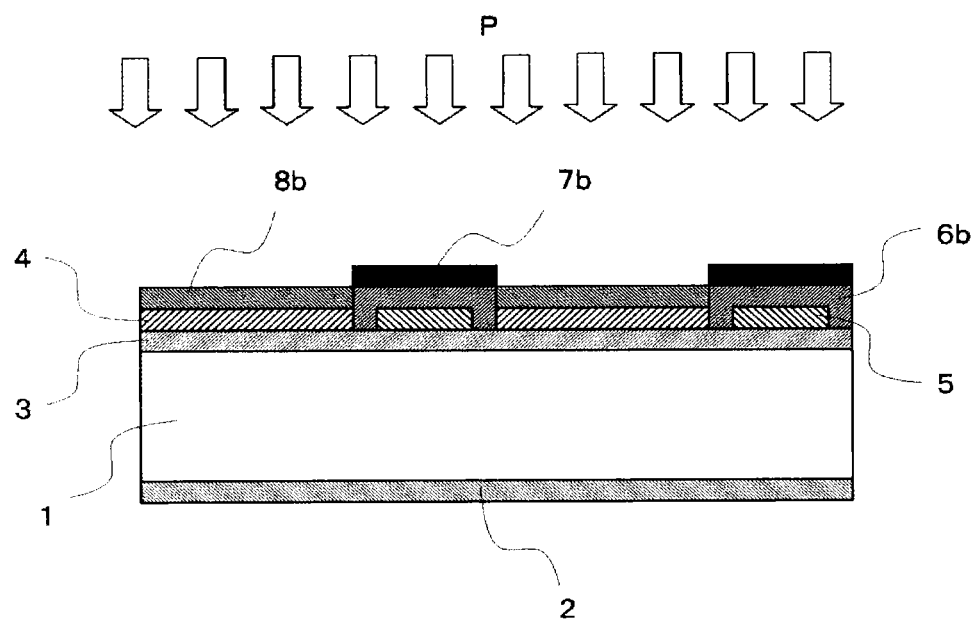
FIG. 14 is an enlarged sectional view illustrating another step for manufacturing the photovoltaic element according to Embodiment 2 of the present invention.

In this embodiment, instead of applying, as described in Embodiment 1, the reducing plasma to the transparent conductive film 6a on the n-type amorphous silicon 5, oxidizing plasma is applied to the transparent conductive film 6b on the p-type amorphous silicon film 4 so that the conductive film is changed into a transparent conductive film 8b. FIG. 13 and FIG. 14 are enlarged sectional views illustrating steps for manufacturing a photovoltaic element of this embodiment. A protective mask 7b is formed above a region including the n-type amorphous silicon 5; and by applying the oxidizing plasma P including oxygen plasma (oxygen ion), the transparent conductive film Gb is changed into the transparent conductive film 8b. This reduces the carrier density of the transparent conductive film 8b, thereby increasing the work function. Because steps after the plasma application are the same as those in Embodiment 1, those explanations will be omitted.

Taking into account that the majority carrier of the p-type silicon are holes, an ohmic junction can be obtained when the work function of the transparent conductive film 8b is larger than the ionization potential of the p-type amorphous silicon film 4. That is, because the work function of the transparent conductive film Gb becomes smaller, its junction state with the p-type amorphous silicon film 4 becomes an ohmic junction or nearly ohmic one, thereby reducing the resistivity. Also in this embodiment, a good photoelectric conversion property and a high productivity can be obtained while integrally forming the transparent conductive films.

Embodiment 3

Figure 15:
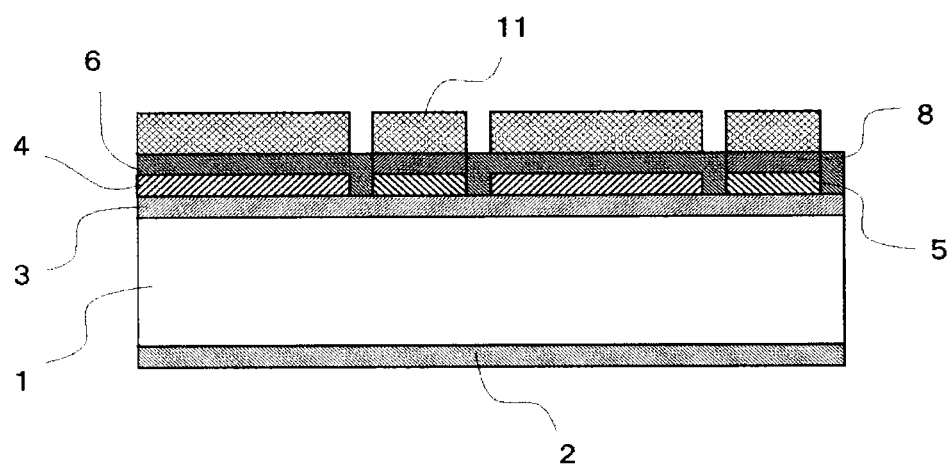
FIG. 15 is an enlarged sectional view illustrating a step for manufacturing a photovoltaic element according to Embodiment 3 of the present invention.
Figure 16:
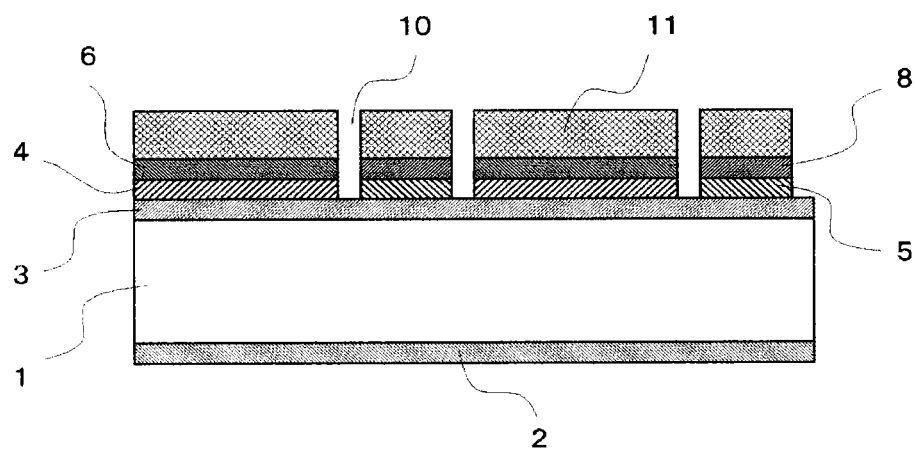
FIG. 16 is another enlarged sectional view illustrating the step for manufacturing the photovoltaic element according to Embodiment 3 of the present invention.

The laser scribing is not the only method for separating the metal electrode layer 9 into the region above the p-type amorphous silicon film 4 and that above the n-type amorphous silicon film 5, and further separating the transparent conductive film 6a and the transparent conductive film 8a. In Embodiment 2, wet etching is used as an alternative to the laser scribing. FIG. 15 and FIG. 16 are enlarged sectional views illustrating a step for manufacturing the photovoltaic element of the embodiment of the present invention. Because the steps of FIG. 3 to FIG. 9 are the same as those in Embodiment 1, their explanations will be omitted. After plasma application, thick-film paste containing metal particles such as Ag (silver), Al (aluminum), or Cu (copper) is printed on respective surfaces of the transparent conductive film 6 and the transparent conductive film 8, and is dried, and then annealed for forming collector electrodes 11. FIG. 15 shows a state after the collector electrodes 11 are formed.

After forming the collector electrodes 11, the transparent conductive film existing between the p-type amorphous silicon film 4 and the n-type amorphous silicon 5 is removed by etching. A region existing as a portion of the transparent conductive film 6 in FIG. 15 is removed to complete a configuration as shown in FIG. 16. In a case where the transparent conductive film 6 is $In_2O_3$ or ITO, a solution such as ferric chloride solution, iodic acid solution, aqua regia, or oxalic acid solution may be used for etching the transparent conductive film 6. The oxalic acid solution may be mixed with dodecylbenzenesulfonic acid.

According to Embodiment 3, while formation of the transparent conductive films is performed at one time, subsequent patterning can be performed with an easy process. The back contact heterojunction photovoltaic element having the excellent property can be obtained while using the easy process.

In order to raise the photoelectric conversion efficiency by narrowing the gap between the p-type amorphous silicon film 4 and the n-type amorphous silicon 5, fine etching may be performed using an etching resist after forming the metal electrode layers 9 of thin films. Using the patterned metal electrode layers 9 as masks, the transparent conductive film can be etched.

Embodiment 4

If the laser beam or the etching solution damages the i-type amorphous silicon film 3 in separating the transparent conductive film on the amorphous silicon film, the passivation of the monocrystalline silicon substrate 1 sometimes becomes insufficient, lowering the photoelectric conversion efficiency. Therefore, in this embodiment, an isolation layer is formed for protecting the i-type amorphous silicon film 3.

Figure 17:
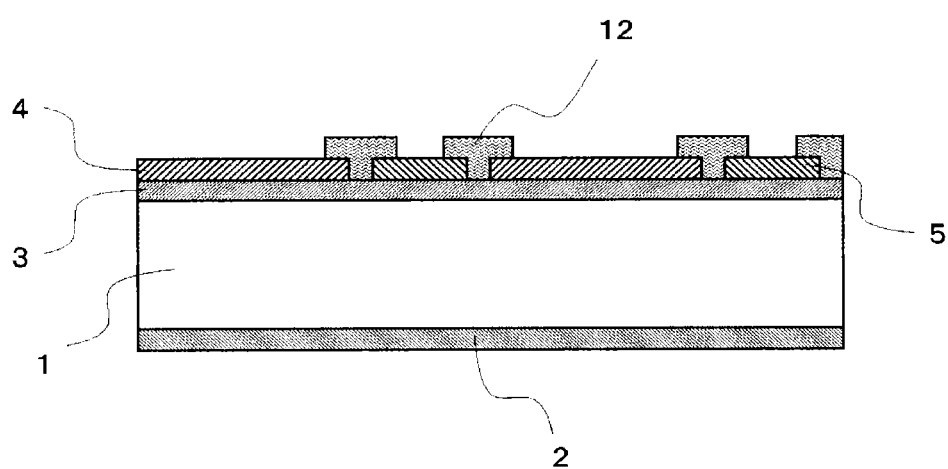
FIG. 17 is an enlarged sectional view illustrating a step for manufacturing a photovoltaic element according to Embodiment 4 of the present invention.
Figure 18:
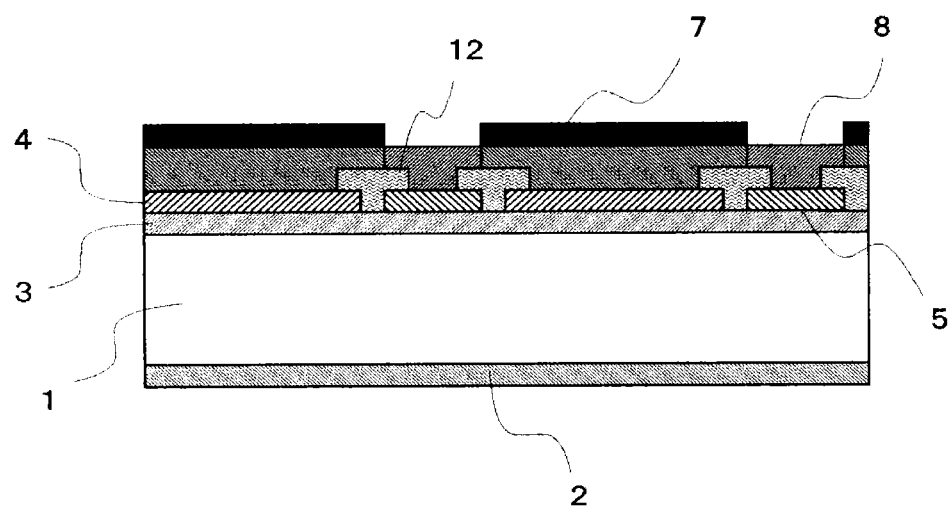
FIG. 18 is an enlarged sectional view illustrating another step for manufacturing the photovoltaic element according to Embodiment 4 of the present invention.
Figure 19:
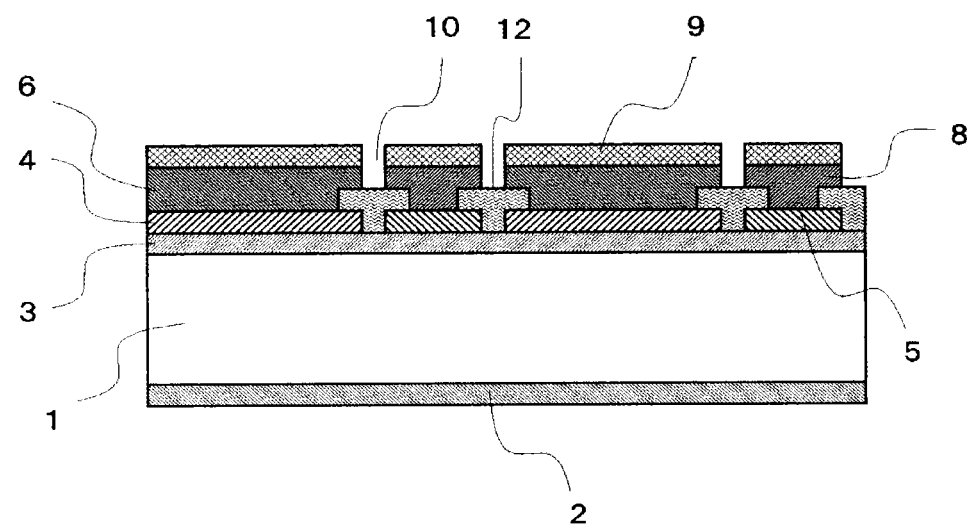
FIG. 19 is an enlarged sectional view illustrating another step for manufacturing the photovoltaic element according to Embodiment 4 of the present invention.

FIGS. 17 and 18 are enlarged sectional views illustrating steps for manufacturing a photovoltaic element according to this embodiment of the present invention. As shown in FIG. 17, an isolation layer 12 is formed in the gap between the p-type amorphous silicon film 4 and the n-type amorphous silicon 5 on the i-type amorphous silicon film 3. The isolation layer 12 is a thick or thin film containing particulates of metal oxide such as alumina or silica, or nitride such as boron nitride. FIG. 18 shows a state after the plasma is applied to the transparent conductive film 6a on the n-type amorphous silicon 5; FIG. 19 shows a state after the laser scribing is performed. The isolation layer 12 protects the i-type amorphous silicon film 3, therefore the passivation effect for the monocrystalline silicon substrate 1 is not damaged, thereby obtaining a photovoltaic element with excellent photoelectric conversion efficiency while forming the transparent conductive films at one time.

In addition, an alternative to the plasma application used in the embodiment described above may be reduction treatment by heating in a reducing atmosphere, or oxidation treatment by heating in an oxidizing atmosphere.

In the embodiment described above, explanations have been made about the back contact heterojunction photovoltaic element; a similar method can be applied to a back contact diffusion photovoltaic element. In the method for the diffusion photovoltaic element, dopants are diffused directly into the monocrystalline silicon substrate 1 to form a p-type layer and an n-type layer in the substrate, and it is not necessary that an intrinsic semiconductor layer is formed.

PRACTICAL EXAMPLES

The present invention will be explained more specifically below, using practical examples.

Practical Example 1

In Practical Example 1, the photovoltaic element having the structure shown in FIG. 10 was produced by the method of Embodiment 1, and the property thereof was evaluated. For the n-type monocrystalline silicon substrate 1, a square wafer with its crystal orientation (100) was used whose dimensions were 10 cm×10 cm×t200 μm. The production process was as follows.

First, texture structures in a pyramid shape were formed on the substrate surface using NaOH solution. After cleaning the substrate, the passivation film 2 was formed by the CVD method on the side of the light receiving face of the monocrystalline silicon substrate 1; on the back side, the i-type amorphous silicon film 3, the p-type amorphous silicon film 4 and the n-type amorphous silicon film 5 were formed by the CVD method. Table 1 lists conditions for forming the films described above, i.e. the composition and pressure of gas introduced to the film forming chamber and the applied power.

TABLE 1

| Film formation side | Formation Film | Gas composition | Pressure (Pa) | Applied power (W/cm$^2$) |
|---|---|---|---|---|
| Light receiving face | Passivation Film | $SiH_4$: 11.11% $H_2$: 88.89% | 150 | 0.0032 |
| Back face | i-type amorphous silicon film | $SiH_4$: 11.11% $H_2$: 88.89% | 150 | 0.0032 |
| | p-type amorphous silicon film | $SiH_4$: 25.00% $H_2$: 74.75% $B_2H_6$: 0.25% | 100 | 0.0032 |
| | n-type amorphous silicon film | $SiH_4$: 25.00% $H_2$: 74.75% $PH_3$: 0.25% | 300 | 0.0032 |

The widths of the p-type amorphous silicon film formation region 4 and the n-type amorphous silicon film formation region 3 were 4 mm and 2 mm, respectively. The width of the p-type amorphous silicon film formation region 4 was set wider than that of the n-type amorphous silicon film formation region 5 so that the property of the photovoltaic element was improved.

Next, the transparent conductive film 6 of indium oxide was formed on the back side by RF sputtering deposition. Table 2 lists the formation conditions.

TABLE 2

| Material | Gas composition | Pressure (Pa) | Applied power (W/cm$^2$) |
|---|---|---|---|
| In$_2$O$_3$ | Ar: 100% | 0.5 | 0.064 |

Next, the protective mask 7 was put directly above the p-type amorphous silicon film formation region of the back side. The material of the protective mask 7 was Al (aluminum). After putting the protective mask 7, plasma was applied to the back side at the conditions of Table 3, using a CVD chamber. Experiments were performed under the conditions that the gas pressure for producing plasma was fixed, and power for maintaining the plasma was varied as a parameter.

TABLE 3

| Gas composition | Pressure (Pa) | Applied power (W/cm$^2$) |
|---|---|---|
| H$_2$: 100% | 67 | 0.026-0.266 |

After applying the plasma, the protective mask 7 was removed, and then, the metal electrode layer 9 was formed on the back side by sputtering. The material of the metal electrode layer 9 was Ag (silver), and the film thickness was 300 nm.

Figure 20:
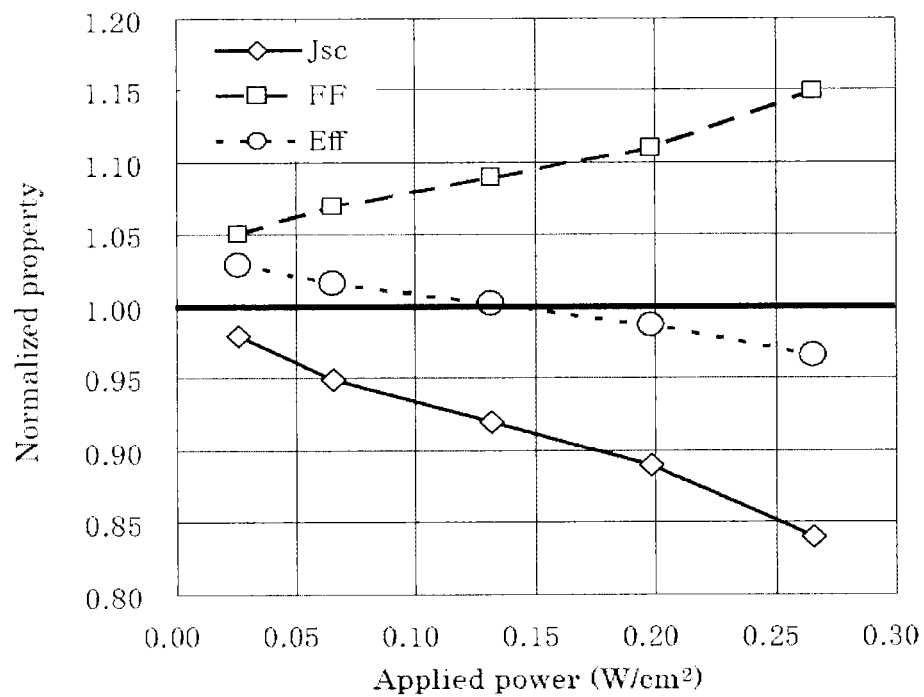
FIG. 20 is a graph showing relations between applied power and normalized properties in Practical Example 1 of the present invention.

Finally, after p-n separation was performed by laser scribing, annealing was performed for an hour at 200 degrees C. in a thermal oxidation furnace for oxidizing the scribed trace. FIG. 20 is a graph showing relations between applied power and normalized properties in the CVD process of Practical Example 1, which were measured for the photovoltaic element (solar battery cell) placed in a solar simulator. The normalized properties are expressed, taking as unity a measured property of a photovoltaic element that was produced without applying plasma as a reference example 1. The production process of the reference element 1 was the same as that in Practical Example 1 except that plasma was not applied. Jsc denotes a normalized current density, FF denotes a normalized fill factor, and Eff denotes a normalized conversion efficiency. As shown in FIG. 20, as increasing the applied power for plasma, the fill factor FF increases. It is considered that this is because an increase of the carrier density in the transparent conductive film causes the work function to become smaller, to reduce the contact resistance between the n-type amorphous silicon film and the conductive film. However, when the applied power exceeds 0.132 W/cm$^2$, the normalized conversion efficiency falls below unity. The reason for this is considered that reduction of the transparent conductive film also deteriorates an optical property to lower the current density at the same time. That is, a range in which the cell property is enhanced in comparison to the reference element 1 is an applied power range of 0.026 to 0.132 W/cm$^2$; and the property improvement effect by applying the plasma to the transparent conductive film appeared in this condition.

In addition, the transparent oxide such as In$_2$O$_3$ or ZnO has a characteristic that oxygen thereof comes out in the reduction atmosphere. As the oxygen is reduced, the carrier density is increased and, at the same time, the transparent oxide darkens, thereby decreasing the transmissivity. Therefore, when the plasma application in the reduction atmosphere is continued, the transmissivity is decreased, so that light (mainly, infrared light) having passed through the inside of the cell is absorbed. This resultantly lowers the current density, to lower the photoelectric conversion efficiency.

Practical Example 2

In Practical Example 2, the same production process as that in Practical Example 1 was used except for the plasma application conditions. Table 4 shows the plasma application conditions in Practical Example 2. The experiment was performed under the conditions that the applied power is constant, and the gas pressure for producing the plasma is varied as a parameter.

TABLE 4

| Gas composition | Pressure (Pa) | Applied power (W/cm$^2$) |
|---|---|---|
| H$_2$: 100% | 67-800 | 0.026 |

Figure 21:
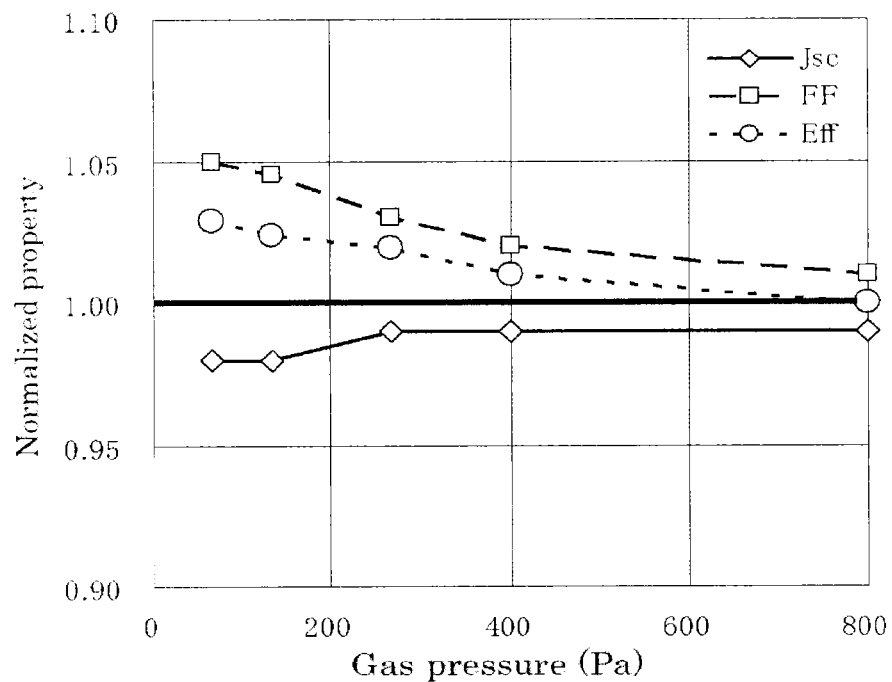
FIG. 21 is a graph showing relations between gas pressure and normalized properties in Practical Example 2 of the present invention.

FIG. 21 is a graph that shows relations between the gas pressure and normalized properties in Practical Example 2 according to the present invention, and which shows a normalized current density Jsc, a normalized fill factor FF, and a normalized conversion efficiency Eff of the photovoltaic element produced according to Practical Example 2. The normalized properties in FIG. 21 are expressed, taking as unity a cell property of a photovoltaic element that was produced without applying plasma as a reference example 2. The production process of the reference element 2 was the same as that in Practical Example 2 except that plasma was not applied. As shown in FIG. 21, the fill factor of Practical Example 2 increases within a pressure range of the gas for producing the plasma. In a range from 67 Pa to 800 Pa, the property of the photovoltaic element is improved in comparison with the reference example 2, and the lower the gas pressure, the better the property.

Practical Example 3

Except for the plasma application conditions and the material of the transparent conductive film 6, the production process of Practical Example 3 was all the same as that of Practical Example 1. Table 5 shows the formation conditions for a transparent conductive film 6 in Practical Example 3. The transparent conductive film 6 is a TCO material, the so-called AZO, which is zinc oxide doped with aluminum. Table 6 shows plasma application conditions in Practical Example 3, in which larger power is applied in comparison to the case of the indium oxide previously described. This is because ZnO:Al is more resistant to plasma reduction than In$_2$O$_3$.

TABLE 5

| Material | Gas composition | Pressure (Pa) | Applied power (W/cm$^2$) |
|---|---|---|---|
| Zn: Al (3 wt %) | Ar: 100% | 0.4 | 0.056 |

TABLE 6

| Gas composition | Pressure (Pa) | Applied power (W/cm$^2$) |
|---|---|---|
| H$_2$: 100% | 67 | 0.13-1.33 |

Figure 22:
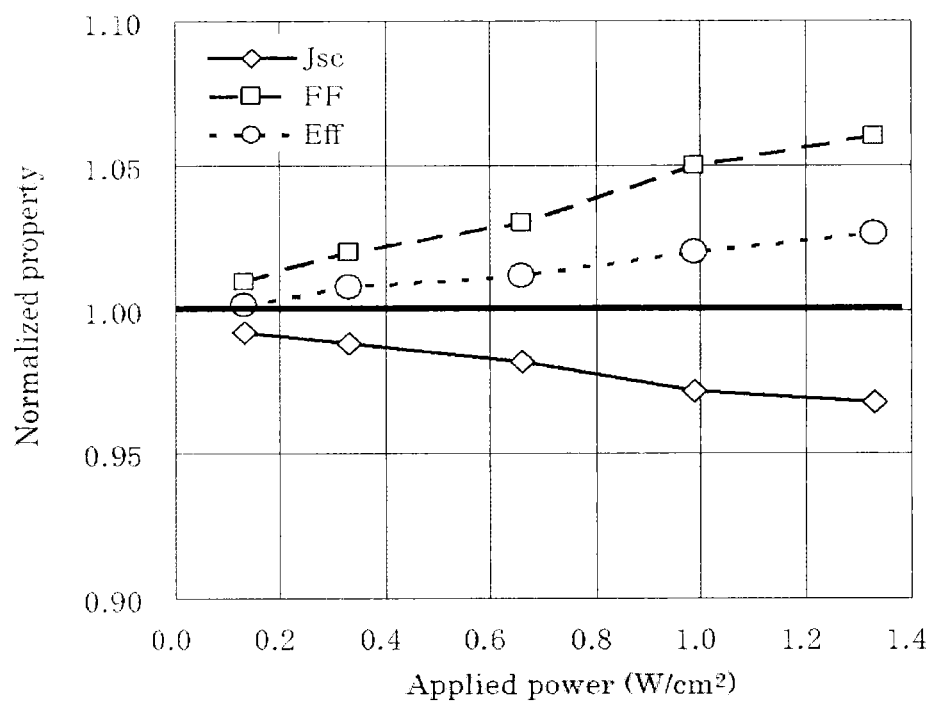
FIG. 22 is a graph showing relations between applied power and normalized properties in Practical Example 3 of the present invention.

FIG. 22 is a graph showing relations between applied power and normalized properties in Practical Example 3 according to the present invention, which shows a normalized current density Jsc, a normalized fill factor FF, and a normalized conversion efficiency Eff of the photovoltaic element produced according to Practical Example 2. They are expressed, taking as unity a property of a photovoltaic element that was produced without applying plasma as a reference example 3. The production process of the reference example 3 was the same as that in Practical Example 3 except that plasma was not applied. As shown in FIG. 22, the plasma application caused the fill factor and the conversion efficiency to be increased within a range in which the applied power was varied, enhancing the properties of the photovoltaic element.

NUMERAL EXPLANATION 1 monocrystalline silicon substrate
2 passivation film
3 i-type amorphous silicon film
4 p-type amorphous silicon film
5 n-type amorphous silicon
6, 6*a*, 6*b* transparent conductive film
7, 7*a*, 7*b* protective mask
8, 8*a*, 8*b* transparent conductive film
9 metal electrode layer

The invention claimed is:

1. A method of manufacturing a photovoltaic element, comprising:
   a step of forming an n-type semiconductor layer on a first region of a face of a semiconductor crystal substrate;
   a step of forming a p-type semiconductor layer on a second region of the face;
   a step of integrally forming a contact electrode layer, whose chief element is oxide, on the face, and surfaces of the n-type semiconductor layer and the p-type semiconductor layer;
   a step of adjusting a carrier density of the contact electrode layer above either the first region or the second region so that a carrier density of the contact electrode layer above the first region becomes larger than a carrier density of the contact electrode layer above the second region; and
   a step of cutting the contact electrode layer to separate the contact electrode layer above the first region and the contact electrode layer above the second region.

2. The method of manufacturing a photovoltaic element according to claim 1, wherein the semiconductor crystal substrate is a silicon wafer, and oxide composing the contact electrode layer includes any one of indium oxide, titanium oxide, tin oxide, and zinc oxide.

3. The method of manufacturing a photovoltaic element according to claim 2, further comprising:
   a step of forming an intrinsic silicon layer on the face of the semiconductor crystal substrate,
   wherein the n-type semiconductor layer and the p-type semiconductor layer are amorphous silicon films, and the n-type semiconductor layer and the p-type semiconductor layer are formed on the intrinsic silicon layer.

4. The method of manufacturing a photovoltaic element according to claim 1, wherein the step of adjusting the carrier density of the contact electrode layer above the second region, comprises:
   a step of disposing a protective mask that covers the contact electrode layer above the first region; and
   a step of applying oxidizing plasma to the contact electrode layer above the second region.

5. The method of manufacturing a photovoltaic element according to claim 1, wherein the step of adjusting the carrier density of the contact electrode layer above the first region, comprises:
   a step of disposing a protective mask that covers the contact electrode layer above the second region; and
   a step of applying reducing plasma to the contact electrode layer above the first region.

6. The method of manufacturing a photovoltaic element according to claim 1, wherein a laser beam is radiated above a third region that divides the first region and the second region, to cut the contact electrode layer and separate the contact electrode layer above the first region and the contact electrode layer above the second region.

7. The method of manufacturing a photovoltaic element according to claim 1, further comprising:
   a step of forming a metal electrode layer on the contact electrode layer above the first region and the contact electrode layer above the second region; and
   a step of performing wet etching to the contact electrode layer on a third region that divides the first region and the second region.

8. The method of manufacturing a photovoltaic element according to claim 3, wherein a laser beam is radiated above a third region that divides the first region and the second region, to cut the contact electrode layer and separate the contact electrode layer above the first region and the contact electrode layer above the second region.

9. The method of manufacturing a photovoltaic element according to claim 8, further comprising:
   a step of disposing an isolation member on the intrinsic silicon layer on the third region that divides the first region and the second region.

10. The method of manufacturing a photovoltaic element according to claim 3, further comprising:
    a step of forming a metal electrode layer on the contact electrode layer above the first region and the contact electrode layer above the second region; and
    a step of performing wet etching to the contact electrode layer on a third region that divides the first region and the second region.

11. The method of manufacturing a photovoltaic element according to claim 10, further comprising;
    a step of disposing an isolation member on the intrinsic silicon layer on the third region that divides the first region and the second region.

* * * * *